(12) United States Patent
Wijdenes

(10) Patent No.: US 7,098,545 B2
(45) Date of Patent: Aug. 29, 2006

(54) SEMICONDUCTOR DEVICE AND METHOD OF ENVELOPING AN INTEGRATED CIRCUIT

(75) Inventor: Jacob Wijdenes, Eindhoven (NL)

(73) Assignee: Koninklijke Phllips Electronics N.V., Eindhoven (NL)

( * ) Notice: Subject to any disclaimer, the term of this patent is extended or adjusted under 35 U.S.C. 154(b) by 0 days.

(21) Appl. No.: 10/496,341

(22) PCT Filed: Nov. 20, 2002

(86) PCT No.: PCT/IB02/04942

§ 371 (c)(1),
(2), (4) Date: May 21, 2004

(87) PCT Pub. No.: WO03/044858

PCT Pub. Date: May 30, 2003

(65) Prior Publication Data

US 2005/0082681 A1    Apr. 21, 2005

(30) Foreign Application Priority Data

Nov. 23, 2001 (EP) .................................. 01204504

(51) Int. Cl.
*H01L 23/29* (2006.01)
(52) U.S. Cl. ................ 257/790; 257/791; 257/792; 257/793; 257/794
(58) Field of Classification Search ................ 257/678, 257/666, 673, 793, 786–794, E23.126, E23.127, 257/E23.134, 667
See application file for complete search history.

(56) References Cited

U.S. PATENT DOCUMENTS

| | | | | |
|---|---|---|---|---|
| 4,849,857 A | * | 7/1989 | Butt et al. | 361/708 |
| 4,984,059 A | * | 1/1991 | Kubota et al. | 257/676 |
| 5,036,024 A | * | 7/1991 | Mine et al. | 29/827 |
| 5,171,716 A | * | 12/1992 | Cagan et al. | 438/113 |
| 5,629,566 A | * | 5/1997 | Doi et al. | 257/789 |

(Continued)

FOREIGN PATENT DOCUMENTS

| | | |
|---|---|---|
| EP | 0 407 585 | 1/1991 |
| EP | 0 501 564 | 2/1992 |

OTHER PUBLICATIONS

DJennas et al: "Investigation of Plasma Effects on Plastic Packages Delamination and Cracking", Dec. 16, 1993, No. 08, 8091 IEEE Transactions on Components, Hybrids, and Manufacturing Technology, New York, US.

(Continued)

*Primary Examiner*—Kenneth Parker
*Assistant Examiner*—Chris C. Chu
(74) *Attorney, Agent, or Firm*—Peter Zawilski

(57) ABSTRACT

A package of a semiconductor device comprising an integrated circuit (10) generally comprises an inner layer (21) and an outer layer (16), which layers (16,21) have a mutual interface (24). An improved stability of the package is realized in that the interface (24) encloses a delamination area (22), which area (22) is isolated from any bond pads (18) of the integrated circuit (10). The delamination area (22) may be created by a pattern-wise activation of a surface of the inner layer (21). A quantity of a curable polymer may be disposed on this surface to achieve this.

6 Claims, 2 Drawing Sheets

U.S. PATENT DOCUMENTS

| | | | |
|---|---|---|---|
| 5,863,810 A * | 1/1999 | Kaldenberg | 438/27 |
| 5,959,362 A * | 9/1999 | Yoshino | 257/778 |
| 6,046,506 A * | 4/2000 | Hikita et al. | 257/787 |
| 6,087,006 A * | 7/2000 | Tanaka et al. | 428/411.1 |
| 6,147,374 A * | 11/2000 | Tanaka et al. | 257/295 |
| 6,429,513 B1 * | 8/2002 | Shermer et al. | 257/714 |
| 6,624,058 B1 * | 9/2003 | Kazama | 438/612 |
| 6,707,166 B1 * | 3/2004 | Noguchi | 257/790 |

OTHER PUBLICATIONS

English Translation of JP63-151054.
English Translation of JP62-185343.

* cited by examiner

SEMICONDUCTOR DEVICE AND METHOD OF ENVELOPING AN INTEGRATED CIRCUIT

The invention relates to a semiconductor device comprising a carrier and an integrated circuit comprising one or more semiconductor elements and one or more connection regions by which the semiconductor elements are contacted, the circuit being isolated from the environment by an envelope, said envelope comprising an inner layer and an outer layer which have a mutual interface, the carrier comprising electrically conductive portions by which the connection regions are connected via a connection means.

The invention also relates to a method of enveloping an integrated circuit in an envelope comprising an inner layer and an outer layer having a mutual interface, which method comprises the steps of disposing the inner layer on a surface of the integrated circuit, activating a surface of the inner layer, and disposing the outer layer on the surface of the inner layer, thus forming the mutual interface.

Such a semiconductor device and such a method are known from JP-A 62-185343. The inner layer of the known device comprises a silicon material. The outer layer comprises an epoxy resin filled with quartz or glass powder. Furthermore, interconnect structures are provided. The connection means is a bond wire. The integrated circuit is covered with a passivation layer so as to be protected against damage and fouling during further processing and subsequent useful life. This layer consists of, for example, one or more layers of phosphorus silicate glass or silicon nitride.

Differences in thermal coefficients of expansion between the material of the outer layer and the passivation layer may give rise to large mechanical stresses in the semiconductor device in case of temperature variations, more particularly when the dimensions of the integrated circuit are relatively large. This is the case, for example, when an envelope of the chip-scale package type is used. These stresses and the microcracks developed in the passivation layer owing to the stresses may give rise to damaging of the circuit, so that functional defects and even breakdown of the semiconductor device may occur. Moisture from the environment can reach the circuit through the cracks and cause corrosion there. In order to reduce said defects, an inner layer of a synthetic resin material, such as polyamide and silicon resin, is customarily used.

The inner layer of the known device contains microcapsules in order to make it resistant to the pressure from the outer layer. Closing of the outer layer, which treatment is performed under pressure, raises the temperature, and the gas present in the microcapsules escapes. This gas forms a cavity between the inner layer and the outer layer of the envelope.

It is a disadvantage of the known device that the presence of a cavity imposes very stringent requirements on the outer layer. If this outer layer is not completely sealed at any one point, moisture can reach the connection regious through the cavity and thus penetrate into the integrated circuit. In addition, the escaping gas may lead to stresses on the outer layer and damage thereof, more particularly if this escape does not take place in a fully controlled manner or if part of the gas escapes at a later stage.

Therefore, it is a first object of the invention to provide a semiconductor device of the type mentioned in the introductory paragraph in which mechanical stresses are reduced.

The first object is achieved in that the mutual interface fully bounds a delamination area as a result of which full bounding the delamination area is isolated from the bonding pads. The mechanical stresses can be removed in a controlled manner by the creation of a delamination area. Since the delamination area is enclosed, there is no chance of moisture penetrating into or otherwise damaging the integrated circuit via this area.

The delamination area is located at or on a surface of the inner layer, as is the interface. It is favorable for the delamination area to have a size from 30 to 70 per cent. of the inner layer surface. Experience has shown that such a proportion between the size of the delamination area and the adhesive area works well. The optimum proportion is found to be dependent on the difference in coefficient of expansion between the inner and outer layer. Thus it may happen that there is adhesion only around the connection regions of the integrated circuit. But this is also amply sufficient. When the mechanical stresses can escape, there is no need to have the remaining portion of the inner layer adhere to the outer layer.

In an advantageous embodiment, an amount of hardened synthetic resin is present in the delamination area. The presence of such a synthetic resin is the result of an embodiment of the method according to the invention. The synthetic resin, for example an epoxy resin, an acrylate, or a silicone rubber, may be disposed in a simple manner on the inner layer with a dispenser device, with an inkjet printer, or in some other manner. After this the surfaces of the synthetic resin and of the inner layer are activated. Then the outer layer is disposed. Since the portion of the surface covered by the synthetic resin is not activated, the adhesion between the synthetic resin and the inner layer is less good than the activated part. Alternatively, it is possible for the synthetic resin to be disposed only after the activation. In that case the adhesion between the synthetic resin and the outer layer is less good. When, the semiconductor device undergoes a subsequent soldering process at high temperature, the mechanical stresses will concentrate on the non-activated surface of the synthetic resin. During this process the delamination area is formed.

As an alternative to hardened synthetic resin some other material may be used which may be locally disposed on the inner layer and which has an at least relatively poor adhesion to the inner layer or to the outer layer. It is then advantageous for the material to be disposed as a fluid, but it is required that the material must not spread over the surface of the inner layer. Furthermore it is required that the material must not expand substantially at the temperature of the soldering operation.

It is preferred for the inner layer to leave the connection regions uncovered. Such an embodiment of the semiconductor device is generally known and applicable in various ways. Known bonding means are, inter alia, bond wires and globules of a conductive material such as solder. Alternatively, the inner layer itself is the bonding means. This is the case when a capacitive or inductive coupling is used for the bonding between the integrated circuit and the carrier. This case is highly advantageous for identification purposes, where there is a limited transfer of data and energy. The carrier may comprise an antenna that provides a contactless coupling to a reading device.

In a further embodiment, the envelope is fixed to or on the carrier. The carrier of the semiconductor device according to the invention may be a lead frame, or alternatively a printed circuit board, a ceramic substrate, or some other substrate. In this embodiment, which is also known as a chip-scale package type, the outer layer of the cover is not provided until the integrated circuit has been fixed to the substrate. The integrated circuit may then be connected to conductive parts on the carrier by a ball-grid array type of bonding. It may also be that the substrate has an envelope consisting of an inner layer and an outer layer. Owing to the great difference in thermal expansion between the mostly silicon, substrate and the outer layer, it is advantageous also in this case that a delamination area is present.

It is a second object of the invention to provide a method of the type set forth in the introductory section in which mechanical stresses can be removed in a controlled manner.

The second object is achieved in that the activation of the surface of the inner layer takes place in accordance with to a pattern during which a delamination area at or on the surface of the inner layer remains inactivated. The patterned activation causes a delamination area to evolve. When mechanical stresses occur, they will be discharged by delamination in the delamination area. The formation of microscopic and other cracks close to the connection regions is thus avoided or at least strongly reduced.

Activation in a pattern may be effected in various ways. In a first embodiment, the activation takes place with light from a light source. A mask is positioned between the light source and the surface of the inner layer during this. This mask may be installed in front of the light source. It may also be installed as a layer on top of the inner layer. An example of such a layer is a photoresist. The layer could be removed after the activation has stopped. However, it is advantageous to provide an amount of liquid material on the inner layer, which amount need not be removed after the activation has stopped. It is an advantage of the amount of liquid material that the resulting delamination area has a round, oval, or otherwise cornerless shape. Corners in the boundary area of the delamination area form weak spots at which cracks may commence. Since an amount of a liquid material has a rounded surface, there is furthermore a proper bonding to the outer layer.

In a second embodiment, the entire surface of the inner layer is activated, after which a cover of the inner layer is provided locally. The cover is, for example, an amount of a liquid material. When the outer layer is subsequently applied, the adhesion between the cover and the outer layer will be less strong than between the—activated—surface of the inner layer and the outer layer. This defines the delamination area.

By suitably positioning said amount, it is provided that the delamination area is surrounded by areas with proper adhesion. The latter areas can convey the stress to the delamination area, which stress has developed when the outer layer was disposed, which conveyance is advantageous to the adhesion and reduces the risk of undesired stresses. The positioning is preferably designed once and thereafter determined by the use of a template. On the other hand, it is possible to utilize printing techniques in which the template is implemented in the pattern on the stamp surface. A suitable example of such a printing technique is microcontact printing.

The liquid material is preferably provided in the form of a drop. Such a drop is provided, for example, disposed with a dispenser device. This is preferred in that the amount of material can be set like by adapting the dispenser time, the diameter of the needle, or the application pressure. The liquid material is preferably a polymer that can be cured, such as an epoxy resin or an acrylate. The desired size and location of the drop depends on the geometry of the design. The drop may be provided either on the lowerside or on the upper side, or on both sides of the integrated circuit.

The inner layer preferably comprises a silicon material, which generally comprises a dialkylsiloxane as a repetitive unit. Alternatively, a polyamide may be applied.

The curable material may be activated inter alia by means of a plasma or a corona treatment. A preferred embodiment is an oxygen plasma treatment. This treatment may take place under atmospheric pressure as well as under low pressure. It is an advantage of the treatment that it lasts only a few seconds.

These and further aspects of the semiconductor device and the method according to the invention will be further explained with reference to a drawing and a description of the Figures, in which.

Figure 1:
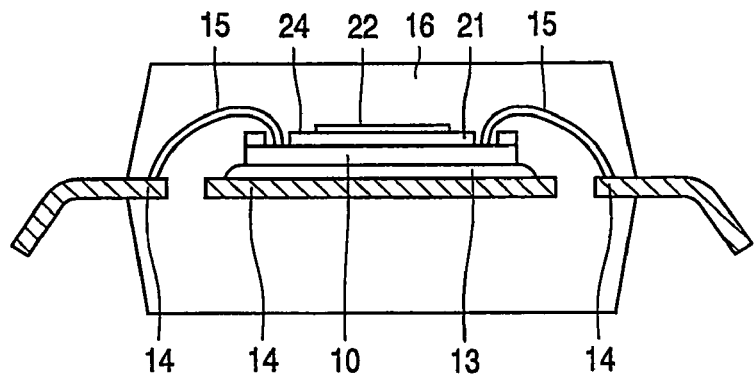
FIG. 1 is a diagrammatic cross-sectional view of the semiconductor device.

FIG. 1 is a diagrammatically a cross-sectional view of a semiconductor device. An integrated circuit 10 made in and on a silicon substrate is connected to a lead frame 14 by an adhesive layer 13 (for example silver paste). The lead frame 14 usually consists of a FeNi or CuFe alloy. The integrated circuit is connected by bond wires 15 to the lead frame 14 and is covered by an inner layer 21 of the envelope. This inner layer 21 in this example comprises a silicone rubber. A passivation layer (not shown), usually silicon nitride, is located between the integrated circuit 10 and the inner layer 21. The whole is encapsulated in an outer layer 16 of the envelope, usually an epoxy resin filled with quartz powder or glass powder.

Figure 2:
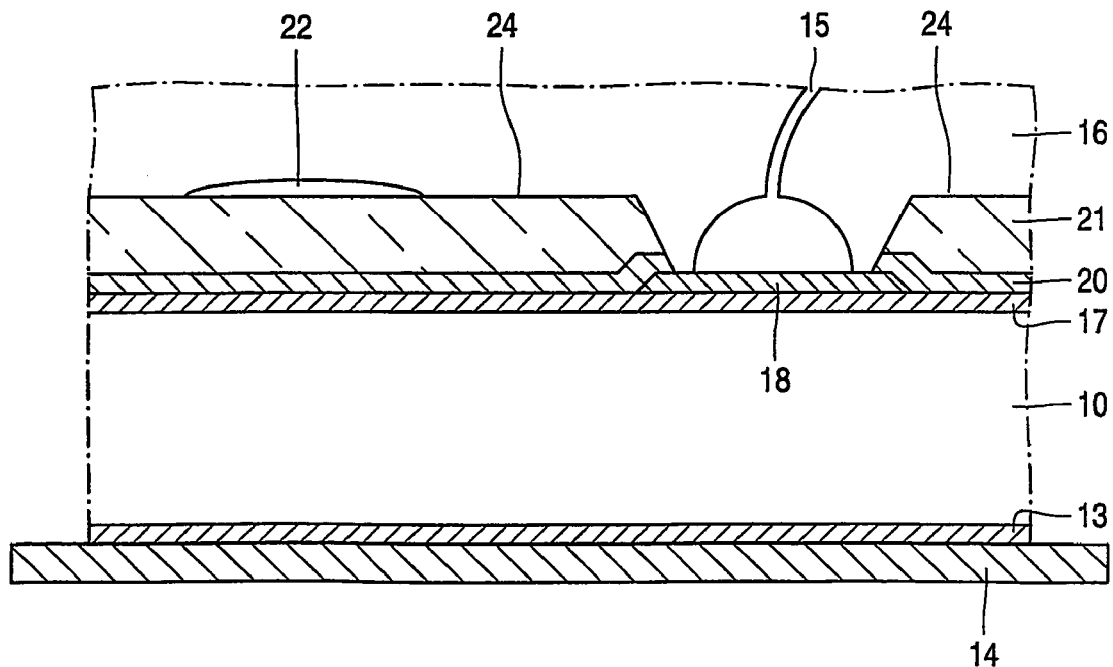
FIG. 2 is a diagrammatic cross-sectional view of a detail of the semiconductor device.

FIG. 2 shows a detail of the semiconductor device shown in FIG. 1. A silicon oxide layer 17 covers the integrated circuit 10. Aluminum bond pads 18 are located on the silicon oxide 17. The whole integrated circuit is covered by a passivation layer 20 of silicon nitride with openings provided at the bond pads. The thickness of the silicon nitride layer is about 1 micrometer. The silicon nitride layer 20 is applied via a PECVD process.

Subsequently, the silicon wafer comprising a plurality of integrated circuits 10 with a silicon nitride layer 20 is divided into chips (dicing) which are mounted on the lead frame 14. Once the wires 15 have been connected to the lead frame 14 and the bonding pads 18, the whole is covered with an inner layer 21 of poly(dimethylsiloxane). Then a drop of an epoxy resin from a dispenser device of the Varimeter/controller TS9300 type from Techcon Systems Inc. is applied to the inner layer of each chip 10. Subsequently, the drop and the remaining surface are activated by an oxygen plasma in a Tepla 300 microwave plasma system under a pressure of 1 or 2 mbar and at a power of 300 to 500 watts for 5 to 10 seconds. Then the chip 10 is encapsulated in an epoxy resin 16. To this end, the customary filled epoxy resins can be applied such as EMF-6210 (suppliers Sumitomo). The drops result in a delamination area 22 after a thermal treatment of the outer layer 16, which delamination area 22 is bounded by the mutual interface 24.

Figure 3:
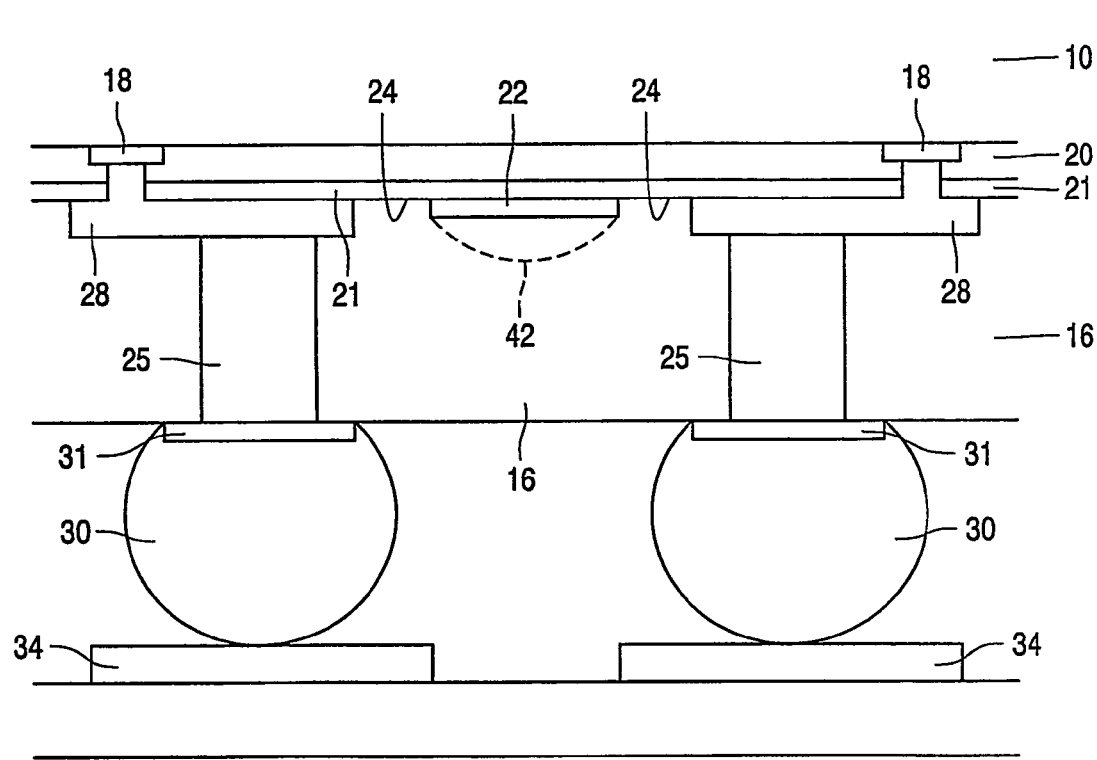
FIG. 3 is a diagrammatic cross-sectional view of a second embodiment of the semiconductor device.

FIG. 3 shows a second embodiment of the semiconductor device according to the invention. The semiconductor device comprises a substrate of a semiconductor material, in this case Si, in which and on which an integrated circuit 10 is provided. The integrated circuit 10 is covered by a passivation layer 20 of silicon nitride which leaves bonding pads 18 of Al exposed. On top of the passivation layer 20 lies the inner layer 21 of polyamide. The bonding pads 18 are connected to solder globules 30 via interconnects 28 and bridges 25 of a conductive material, for example Cu. Barrier layers 31 are located between the bridges 25 and the solder globules 30. The solder globules 30 make contact with conductive portions 34 of the carrier 40.

The outer layer 16 is provided on top of the inner layer 21, the inner and outer layers 21, 16 having a mutual interface 24. A quantity of material that can be cured is also present on the inner layer 21. After the soldering step this material will form the delamination area. As a result of the temperature and pressure then occurring, the inner layer 21 and the outer layer 16 are delaminated from each other in the delamination area 22. In the Figure the delamination is indicated by a dashed line 42. At the same time the mutual interface 24 between the inner layer 21 and the outer layer 16 is intact near the bridges 25 and the interconnects 28.

Summarizing, a package of a semiconductor device comprising an integrated circuit generally comprises an inner layer and an outer layer, which layers have a mutual interface. An improved stability of the package is realized in that the interface encloses a delamination area, which area is isolated from any bonding pads of the integrated circuit. The delamination can be created pattern-wise activation of a surface of the inner layer. Therefore, a quantity of a curable polymer can be disposed on this surface.

The invention claimed is:

1. A semiconductor device comprising a carrier and an integrated circuit which:

comprises one or more semiconductor elements and one or more connection regions by which the semiconductor elements are contacted, and is isolated from an environment by an envelope, said envelope comprising an inner layer, a cover layer of liquid synthetic resin, and an outer layer, the cover layer providing a mutual interface between the inner layer and the outer layer;

carrier comprises electrically conductive portion by which the connection regions are connected via a connection means, characterized in that the mutual interface fully bounds a delamination area, as a result of which full bounding of the delamination area is isolated from the connection regions.

2. A semiconductor device as claimed in claim 1, characterized in that the delamination area and the interface are located on a surface of the inner layer and the delamination area has a size of between 30 and 70 per cent of the surface area of the inner layer.

3. A semiconductor device as claimed in claim 1, characterized in that the inner layer leaves bonding pads exposed.

4. A semiconductor device as claimed in claim 1, characterized in that a quantity of a cured synthetic resin is located in the delamination area.

5. A semiconductor device as claimed in claim 1, characterized in that the envelope is attached to or on the carrier.

6. A semiconductor device as claimed in claim 1, characterized in that the carrier is a lead frame.

* * * * *